United States Patent [19]

Borrelli et al.

[11] Patent Number: 4,514,053

[45] Date of Patent: Apr. 30, 1985

[54] INTEGRAL PHOTOSENSITIVE OPTICAL DEVICE AND METHOD

[75] Inventors: Nicholas F. Borrelli, Elmira; David L. Morse; Paul A. Sachenik, both of Corning, all of N.Y.

[73] Assignee: Corning Glass Works, Corning, N.Y.

[21] Appl. No.: 520,178

[22] Filed: Aug. 4, 1983

[51] Int. Cl.³ ............................ G02B 5/18; G02B 3/00
[52] U.S. Cl. .................................. 350/162.2; 350/413; 430/13; 430/17; 430/321
[58] Field of Search ...................... 350/162.11, 162.17, 350/162.2, 413; 430/13, 17, 321, 350

[56] References Cited

U.S. PATENT DOCUMENTS 4,403,031  9/1983  Borrelli et al. ...................... 430/321

Primary Examiner—John K. Corbin
Assistant Examiner—William Propp
Attorney, Agent, or Firm—C. S. Janes, Jr.

[57] ABSTRACT

An integral optical device is disclosed that is composed of a photosensitive glass having an optical pattern developed therein by a refractive index change due to formation of colloidal metal particles and/or crystalline microphases nucleated by such particles. In a specific embodiment the pattern is composed of at least one transparent lens system having a radial gradient refractive index distribution of prescribed nature.

11 Claims, 4 Drawing Figures

INTEGRAL PHOTOSENSITIVE OPTICAL DEVICE AND METHOD

BACKGROUND OF THE INVENTION

The invention relates to an integral optical device composed of a photosensitive glass body having an optical pattern developed therein by a spatially varying property such as a refractive index change. The change is due to formation of colloidal metal particles and/or crystalline microphases nucleated by such particles. The pattern may be confined to one surface of the glass, as in the case of a grating pattern, or may be a lens system extending through the glass body, such as might be used for imaging purposes.

In one form of particular interest, the optical pattern is composed of at least one transparent lens system having a radial gradient refractive index distribution of prescribed nature. For present purposes, a lens system may be considered as a cylindrical zone extending through a glass body and terminating on opposite faces of the glass body in planar surfaces that function as lens-like elements.

U.S. Pat. No. 4,403,031 (Borrelli and Morse) discloses a method of producing an optical pattern in a porous glass by impregnating the glass with photolyzable organometallic material and selectively photolyzing the impregnated glass. Among the optical patterns that may be created are gradient refractive index patterns, such as lens systems, and optical density patterns.

Optical devices produced with impregnated porous glass show considerable promise, but a non-porous glass body would have obvious advantages in subsequent maintenance. While the porous glass may be consolidated to render it non-porous, that involves a high temperature treatment that is expensive and may result in pattern distortion or deterioration.

The possibility of creating a strip lens by grinding and polishing individual glass or plastic rods has been recognized. The individual rods are arranged in a pattern and bonded in a fixed relation. However, the extreme problems of production and alignment have also been recognized.

Accordingly, a currently commercial imaging device relies on optical effects generated by an array of minute surfaces, each having a defined gradient refractive index distribution. The array is produced by bundling a configuration of optical fibers wherein each fiber has a defined radial gradient index distribution imparted thereto, as by ion exchange or material impregnation.

This device involves a difficult alignment step which limits the device to a maximum of two linear arrays of lens. Further, while decrease in lens size would be desirable, this aggravates the bundling and aligning problems.

PURPOSES OF THE INVENTION

It is then a basic purpose to provide an improved optical device having an optical pattern based on a refractive index change.

Another purpose is to provide such device as an integral glass unit.

A further purpose is to provide an unobvious use for certain photosensitive glasses.

A specific purpose is to produce lenses and lens arrays in a photosensitive glass.

Another specific purpose is to provide an inexpensive means of producing an optical pattern based on a prescribed gradient refractive index distribution.

Another specific purpose is to provide an optical pattern based on development of colloidal metal particles in glass.

SUMMARY OF THE INVENTION

To these and other ends that will become apparent, our invention resides in an integral optical device composed of a body of photosensitive glass having an optical pattern developed therein by a spatially varying property such as a refractive index change. The pattern may be developed within one surface of the glass, as in the case of a grating pattern. Alternatively, it may be a lens system extending throughout the glass body. The optical pattern may result from a radial gradient refractive index distribution due to colloidal metal particles and/or microphases that can be nucleated by such particles, such as NaF, in the selected area. The colloidal metal may be gold, silver, and/or copper, and the optical pattern may be an array of microlenses.

In a particular embodiment designed for imaging purposes, a glass body has an array of cylindrical microlenses developed between two opposed surfaces and terminating in planar ends at such surfaces, each cylindrical microlens having refractive index values varying in a radial direction between cylinder periphery and axis in accordance with a prescribed parabolic distribution.

PRIOR LITERATURE

U.S. Pat. No. 3,658,407 (Kitano et al.) discloses an optical imaging device composed of glass fibers arranged in a bundled configuration such that the flat ends of the fibers present a planar surface. Each fiber has a radial refractive index distribution imparted by ion exchange and thus presents a lens-like element in the planar surface.

U.S. Pat. No. 4,168,900 (Adachi) describes an erect optical imaging system for copying apparatus comprising a first pair of array sets of object lenses and a second pair of array sets of relay lenses spaced from and aligned with the first pair, the first pair producing a real image and the second set producing an erect image. In each pair, one array is offset relative to the other. The lenses are square bars of glass or plastic that are 2 mm on a side.

Photosensitive glass patents of possible interest include:

U.S. Pat. Nos. 2,515,936 (Armistead) and 2,515,937 (Stookey) which disclose silver, and/or gold as photosensitive agents in alkali metal-alkaline earth-silicate glasses, U.S. Pat. No. 2,515,275 which discloses photosensitive silicate glasses containing 0.01% to 0.1% gold (Au), 0.05% to 0.3% silver (AgCl), and/or 0.05% to 1% copper ($Cu_2O$) as the photosensitizing agent, and also containing up to 0.05% $CeO_2$, up to 0.02% $SnO_2$, and up to 0.1% $Sb_2O_3$ to enhance photosensitivity, U.S. Pat. No. 2,515,940 (Stookey) which discloses photosensitive silicate glasses containing 10–25% $Li_2O$ and having gold, silver and/or copper as a photosensitive metal, U.S. Pat. No. 2,684,911 which discloses photosensitive glasses that contain a relatively small amount of silver as photosensitive agent and must be melted reducingly to be effective, U.S. Pat. No. 4,017,318 (Pierson-Stookey) which discloses photosensitive glasses containing alkali halides and silver halides and, through a unique sequence of short wave radiation exposures and heat treatment, adapted to exhibit the total range of colors seen in the visible spectrum, either in the transparent or in the opacified state, and in three dimensions, U.S. Pat. No. 2,911,749 (Stookey) which discloses introducing silver into a glass by ion exchange to develop a two-dimensional photographic image in the glass, and U.S. Pat. No. 3,419,370 (Cramer-Garfinkel) which discloses rendering certain glasses photochromic by silver ion exchange in the glass surface.

Two articles by S. D. Stookey, appearing in Industrial and Engineering Chemistry, Vol. 41, p. 856 (1949) and Vol. 45, p. 115 (1953), discuss photosensitive glasses and their properties.

GENERAL DESCRIPTION

The present invention is based on observations regarding behavior of certain photosensitive glasses that contain minute amounts of cerium oxide and a precious metal such as silver, gold, or copper. Such glasses may have colloidal metal particles, and a consequent absorption color, developed therein by ultraviolet light exposure and heat treatment. The photosensitive process, and the color effects producible thereby, have been described at length in the literature.

It is also possible for such colloidal metal particles to serve as nuclei upon which crystalline microphases, in particular metal halides, may grow. Providing crystal size is maintained sufficiently fine, the glasses remain transparent. Maximum crystal size is about 1000 Angstrom units, although it is generally desirable to keep the size below 500 Angstrom units.

We have now observed that refractive index change also occurs during the photosensitive process. This index change is related to a change in composition and crystal formation brought about by the photo process and subsequent thermal treatment.

The index change may occur by two distinct mechanisms. Where the refractive index change is due to colloidal particles in the glass, it is caused by the optical dispersion effect of the induced absorption. In the second case, where the colloidal particles nucleate a separate microphase, the refractive index change is due to the compositional changes. As long as the particle size of the colloid-nucleated phase is small compared to the wavelength light, the exposed zone remains transparent, but by its microphase composition its refractive index is an admixture of glass and the microphase present.

Thus, the refractive index of the glass initially, that is before exposure, may be taken as $n_o$. After exposure and heat treatment in accordance with the photosensitive process, the exposed glass will have an index determined by the volume fraction and refractive index of the phase, or phases, produced. The index of the exposed region ($n_{ex}$) may then be written as, $$n_{ex} = Xn_x + (1-X)n_g$$

where $n_x$ is the refractive index of the crystal phase, $n_g$ is the index of the residual glass phase, and X is the volume fraction of the crystal phase. The index difference, $\Delta n$, between the exposed and unexposed zones then may be written as, $$\Delta n = n_{ex} - n_o = Xn_x + (1-X)n_g - n_o.$$

Such index changes are observed in photosensitive glasses wherein optical absorption due to colloidal metal occurs, as well as in those where a fine mictophase grows on such coloidal nuclei.

The induced refractive index changes may be observed by exposing a glass sample to ultraviolet light through a mask having a pattern of alternating clear and opaque bars. When the glass samples, thus selectively exposed, are heat treated, colloidal particles develop in the exposed portions of the glass. A Mach-Zehnder interferometer may be used to determine the index difference by measuring the fringe displacement between exposed and unexposed regions.

To produce a graded refractive index change by this phenomenon, one may make use of the fact that the induced refractive index change is proportional to the initial radiation exposure. Control of the radial variations of the exposure intensity can be accomplished by utilizing the near field diffraction effects of light through a small clear or opaque hole. This produces a radial variation of the exposure light whereby the light is brightest/darkest in the middle and decreases/increases toward the outside.

A more direct process would be to use a photomask which has the desired gradient intensity profile. In both cases, the photosensitive materials have an inherent refractive index versus exposure intensity relationship. This then determines the nature of the intensity variations to produce the desired gradient in the radial refractive index pattern. It should be noted that the exposure may produce lower refractive index than the unexposed region, thus dictating a negative mask type exposure.

BRIEF DESCRIPTION OF THE DRAWINGS

In the appended drawings.

SPECIFIC DESCRIPTION

The invention is further described with reference to two specific examples. The first illustrates processing of a typical photosensitive glass, such as disclosed in U.S. Pat. Nos. 2,515,936, 2,515,937 and 2,515,275, wherein color is developed by colloidal metal formation. The second illustrates a photosensitive glass, such as disclosed in U.S. Pat. No. 4,017,318, wherein a microcrystalline phase is grown on gold or silver nuclei. Other glasses in the families may be processed in similar manner, although minor adjustments might be expected to obtain optimum results.

EXAMPLE 1

The photosensitive glass employed had the following composition in parts by weight as calculated from the batch:

| | | | |
|---|---|---|---|
| SiO$_2$ | 63.8 | CeO$_2$ | 0.9 |
| Na$_2$O | 17.2 | Sb$_2$O$_3$ | 0.2 |
| Al$_2$O$_3$ | 2.1 | Au | 0.005 |
| BaO | 10.0 | Cl$^-$ | 0.03 |

| | |
|---|---|
| CaO | 6.8 |

The glass was batched, melted and worked in accordance with procedures disclosed in U.S. Pat. No. 2,515,275. A two mm strip was prepared for present purposes. This was exposed to radiation from a 450 watt mercury/xenon lamp for five minutes. The exposure was through a bar pattern mask in which the bars were 0.5 mm thick and spaced 1 mm apart. Following this exposure, the glass was subjected to heat treatment at 550° C. for one hour.

After heat treatment, a red color was observed in the exposed areas. This was due to a sharp absorption band that peaked in the green portion of the spectrum. This band, in turn, derived from the free electron absorption in small colloidal gold particles (about 50 Angstrom units). Associated with the absorption is a refractive index change through a wavelength dispersion effect. An explanation of the phenomenon may be derived from van der Hulst's text, *Light Scattering by Small Particles*, pp. 32–34, Wiley (1957).

Figure 1:
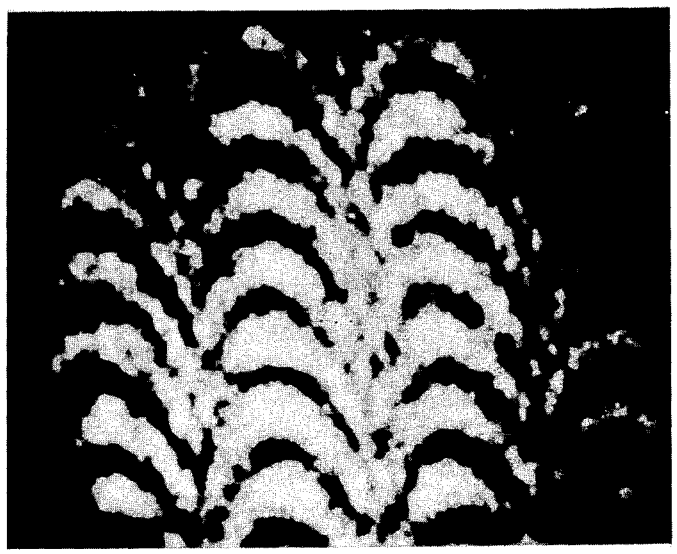
FIG. 1 is an interferogram of the interference pattern produced in the sample of Example 1.

FIG. 1 of the drawing is a photograph of the interference pattern produced by the treatment just described. The interferogram was obtained using a Mach-Zehnder interference microscope.

The fringe displacement through the exposed region indicates an increase of about 0.0006 refractive index units in the exposed region relative to the unexposed, and hence unchanged, region.

EXAMPLE 2

The photosensitive glass used in this study was typical of those disclosed in U.S. Pat. No. 4,017,318. Its composition, in parts by weight as calculated from the batch, was:

| | | | |
|---|---|---|---|
| $SiO_2$ | 69.0 | $Br^-$ | 1.0 |
| $Na_2O$ | 15.8 | $Ag^+$ | 0.01 |
| ZnO | 4.8 | $CeO_2$ | 0.05 |
| $Al_2O_3$ | 6.8 | $Sb_2O_3$ | 0.20 |
| $F^-$ | 2.3 | SnO | 0.05 |

The glass was batched, melted, and worked in accordance with practices disclosed in the patent. Three strips of glass, each two mm in thickness, were prepared, and exposed through a mask having opaque dots on a clear background. The dots were 275 microns in diameter on 500 micron centers. The samples were exposed to radiation from a 2500 watt mercury/xenon lamp. The time of exposure was varied for each sample, times being 15, 25, and 40 minutes. This was followed by a heat treatment for 40 minutes at 480° C., primarily to nucleate silver nuclei. A subsequent treatment at 500° C. for an hour was carried out to grow a NaF phase on the silver nuclei.

After the heat treatment, it was observed that a sodium fluoride (NaF) microcrystalline phase had developed in the exposed region. It was also observed that the refractive index in the exposed region was lower than that in the unexposed glass. Since the refractive index of NaF is somewhat lower than that of the glass, which nominally is about 1.50, it appears that the NaF phase imparts a decreasing influence on the composite value. Conversely, refractive index values increased as one moved radially from the exposed region to the unexposed circles and/or cylinders.

Graded intensity of exposure is produced utilizing diffraction effects from the opaque disks or dots on the clear background of the mask. This enabled producing a gradient index change that increased from the outside to the center of each unexposed circular region.

Figure 2:
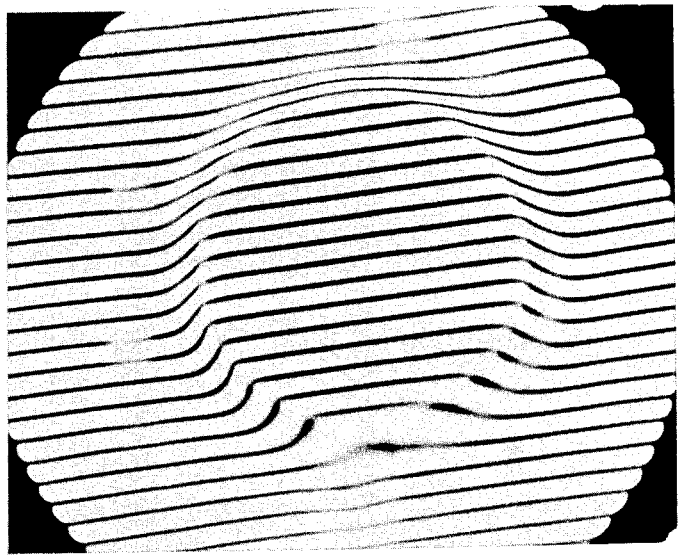
FIGS. 2, 3 and 4 are interferograms of the lens patterns developed in the samples of Example 2 to show pattern difference and refractive index change as a function of exposure time.
Figure 3:
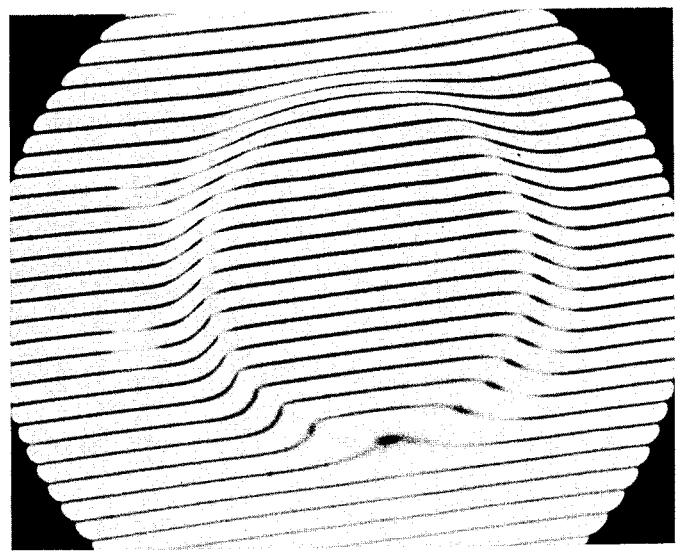
Figure 4:
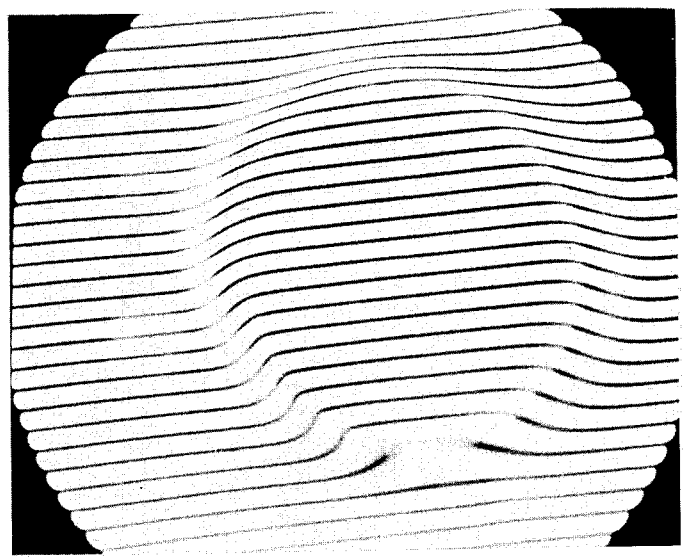

FIGS. 2, 3 and 4 are 200X photographs, taken by a Mach-Zehnder interference microscope, of the samples prepared as just described. The photographs show the index profile through the circular regions as a function of exposure time. Thus, the sample photographed in FIG. 2 was exposed 15 minutes; that in FIG. 3 was exposed 25 minutes; that in FIG. 4 was exposed 40 minutes.

Maximum refractive index changes ($\Delta n$) were determined, and are shown in the following table.

| Time (Minutes) | $\Delta n$ |
|---|---|
| 15 | 0.0011 |
| 25 | $0.0012^-$ |
| 40 | $0.0012^+$ |

A subsequent test showed a $\Delta n$ of 0.0007 for an exposure of five (5) minutes.

A planar lens device has been developed employing the procedures just described. This device has an array of cylindrical elements extending through the glass body, each element utilizing a radial, gradient, refractive index distribution of a parabolic nature. This device was fabricated for imaging purposes. The need for a parabolic index profile to enable high quality imaging is described by Marchand, *Gradient Index Optics*, Academic Press (1978).

We claim:

1. An integral optical device composed of a body of photosensitive glass having an optical pattern developed therein by a spatially varying property due to formation of colloidal metal particles and/or a crystalline microphase nucleated by such particles.

2. An optical device in accordance with claim 1 wherein the optical pattern is produced by colloidal metal particles selected from gold, silver, copper, and mixtures thereof.

3. An optical device in accordance with claim 1 wherein the optical pattern is produced by a crystalline microphase wherein the crystals are not over about 1,000 Angstrom units in size.

4. An optical device in accordance with claim 1 wherein the spatially varying property is a prescribed, radial, gradient refractive index distribution.

5. An optical device in accordance with claim 4 wherein the prescribed distribution is of a generally parabolic nature.

6. An optical device in accordance with claim 1 wherein the spatially varying property occurs within one surface on the body.

7. An optical device in accordance with claim 6 having a grating pattern.

8. An optical device in accordance with claim 1 wherein the spatially varying property is a lens system extending throughout the glass body.

9. An optical device in accordance with claim 1 wherein the optical pattern is composed of at least one transparent lens system composed of a cylindrical zone terminating on opposite faces of the glass body in planar surfaces that function as lens-like elements, the lens system having a radial gradient refractive index distribution of a prescribed nature.

10. An optical device in accordance with claim 9 wherein there is an array of lens systems in closely spaced relationship.

11. An optical device in accordance with claim 9 wherein the gradient refractive index distribution follows a parabolic function.

* * * * *